US012775678B2

(12) United States Patent
Park et al.

(10) Patent No.: US 12,775,678 B2
(45) Date of Patent: Oct. 27, 2026

(54) HARDWARE ACCELERATOR METHOD AND DEVICE

(71) Applicant: Samsung Electronics Co., Ltd., Suwon-si (KR)

(72) Inventors: Junki Park, Suwon-si (KR); Joonsang Yu, Seoul (KR); Jun-Woo Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1280 days.

(21) Appl. No.: 17/499,149

(22) Filed: Oct. 12, 2021

(65) Prior Publication Data

US 2022/0383103 A1 Dec. 1, 2022

(30) Foreign Application Priority Data

May 21, 2021 (KR) ........................ 10-2021-0065369

(51) Int. Cl.

| | |
|---|---|
| ***G06F 17/17*** | (2006.01) |
| ***G06F 7/498*** | (2006.01) |
| ***G06F 7/544*** | (2006.01) |
| ***G06F 7/556*** | (2006.01) |
| ***G06N 3/048*** | (2023.01) |

(Continued)

(52) U.S. Cl.

CPC .............. *G06F 17/17* (2013.01); *G06F 7/544* (2013.01); *G06F 7/556* (2013.01); *G06N 3/048* (2023.01); *G06N 3/08* (2013.01); *H03K 19/17728* (2013.01); *G06F 7/4988* (2013.01); *G06F 2207/4824* (2013.01)

(58) Field of Classification Search

CPC .......... G06F 7/556; G06F 7/544; G06F 7/548; G06F 7/552; G06F 7/4833; G06F 7/483; G06F 17/10; G06F 17/11; G06F 17/17; G06F 7/4988

USPC .......................................... 708/446, 605, 235

See application file for complete search history.

(56) References Cited

U.S. PATENT DOCUMENTS 10,373,050 B2 8/2019 Lin et al.
10,540,145 B2 * 1/2020 Yu ...................... G06F 12/1009

(Continued)

FOREIGN PATENT DOCUMENTS

KR 10-2002-0057255 A 7/2002
KR 10-0842103 B1 6/2008

(Continued)

OTHER PUBLICATIONS

Ramdorai, S., Linear and quadratic approximation <URL: https://www.math.ubc.ca/~sujatha/2013/103/week10-12/Linearapp.pdf> (Year: 2013).*

(Continued)

*Primary Examiner* — Michael D. Yaary

(74) *Attorney, Agent, or Firm* — NSIP Law

(57) ABSTRACT

A processor-implemented hardware accelerator method includes: receiving input data; loading a lookup table (LUT); determining an address of the LUT by inputting the input data to a comparator; obtaining a value of the LUT corresponding to the input data based on the address; and determining a value of a nonlinear function corresponding to the input data based on the value of the LUT, wherein the LUT is determined based on a weight of a neural network that outputs the value of the nonlinear function.

28 Claims, 10 Drawing Sheets

(51) Int. Cl.
*G06N 3/08* (2023.01)
*H03K 19/17728* (2020.01)

(56) References Cited

U.S. PATENT DOCUMENTS

| | | | |
|---|---|---|---|
| 10,789,510 | B2 | 9/2020 | Willcock et al. |
| 10,949,498 | B1 * | 3/2021 | Enumula et al. ....... G06F 7/556 |
| 2016/0162782 | A1 | 6/2016 | Park |
| 2018/0032857 | A1 | 2/2018 | Lele et al. |
| 2018/0082181 | A1 | 3/2018 | Brothers et al. |
| 2018/0181858 | A1 | 6/2018 | Son et al. |
| 2018/0189056 | A1 | 7/2018 | Turakhia et al. |
| 2018/0253636 | A1 | 9/2018 | Lee et al. |
| 2019/0050369 | A1 | 2/2019 | Lan et al. |
| 2019/0057302 | A1 | 2/2019 | Cho et al. |
| 2019/0138898 | A1 | 5/2019 | Song et al. |
| 2019/0147323 | A1 | 5/2019 | Li et al. |
| 2019/0340488 | A1 | 11/2019 | Fishel et al. |
| 2019/0392253 | A1 | 12/2019 | Ji et al. |
| 2020/0005155 | A1 | 1/2020 | Datta et al. |
| 2020/0026998 | A1 | 1/2020 | Maki et al. |
| 2020/0065671 | A1 | 2/2020 | Sahni et al. |
| 2020/0074202 | A1 | 3/2020 | Kim et al. |
| 2020/0082269 | A1 | 3/2020 | Gao et al. |
| 2020/0082273 | A1 | 3/2020 | Rossi et al. |
| 2020/0168271 | A1 | 5/2020 | Vasyltsov et al. |
| 2020/0250842 | A1 | 8/2020 | Lee |
| 2020/0342284 | A1 | 10/2020 | Buyuktosunoglu et al. |
| 2020/0401873 | A1 | 12/2020 | Lin et al. |

FOREIGN PATENT DOCUMENTS

| | | | |
|---|---|---|---|
| KR | 10-2020-0064264 | A | 6/2020 |
| KR | 10-2021-0116182 | A | 9/2021 |

OTHER PUBLICATIONS

Chou et al., Unifying and Merging Well-trained Deep Neural Networks for Inference Stage, 27th International Joint Conference on Artificial Intelligence and the 23rd European Conference on Artificial Intelligence <URL: https://arxiv.org/abs/1805.04980> (Year: 2018).*
NVIDIA, NVIDIA Deep Learning Accelerator (NVDLA) Open Source Project—Documentation (Year: 2020).*
Korean Office Action issued on Oct. 31, 2024, in counterpart Korean Patent Application No. 10-2021-0065369 (2 pages in English, 4 pages in Korean).
Kim, Sehoon, et al. "I-BERT: Integer-only BERT Quantization." *Proceedings of the 38th International Conference on Machine Learning*, arXiv:2101.01321v3 Jun. 8, 2021.

* cited by examiner

HARDWARE ACCELERATOR METHOD AND DEVICE

CROSS-REFERENCE TO RELATED APPLICATIONS

This application claims the benefit under 35 USC § 119(a) of Korean Patent Application No. 10-2021-0065369 filed on May 21, 2021, in the Korean Intellectual Property Office, the entire disclosure of which is incorporated herein by reference for all purposes.

BACKGROUND

1. Field

The following description relates to a hardware accelerator method and device.

2. Description of Related Art

A neural network may be implemented based on a computational architecture. Input data may be analyzed and valid information may be extracted using the neural network in various types of electronic systems. A device for processing the artificial neural network may need a large quantity of computation or operation to process complex input data. Thus, the device may not, in real time, analyze a massive quantity of input data using a neural network and effectively process an operation associated with the neural network to extract desired information.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a processor-implemented hardware accelerator method includes: receiving input data; loading a lookup table (LUT); determining an address of the LUT by inputting the input data to a comparator; obtaining a value of the LUT corresponding to the input data based on the address; and determining a value of a nonlinear function corresponding to the input data based on the value of the LUT, wherein the LUT is determined based on a weight of a neural network that outputs the value of the nonlinear function.

The determining of the address may include: comparing, by the comparator, the input data and one or more preset range values; and determining the address based on a range value corresponding to the input data.

The obtaining of the value of the LUT may include obtaining a first value and a second value corresponding to the address.

The determining of the value of the nonlinear function may include: performing a first operation of multiplying the input data and the first value; and performing a second operation of adding the second value to a result of the first operation.

The method may include performing a softmax operation based on the value of the nonlinear function.

The determining of the value of the nonlinear function may include determining a value of an exponential function of each input data for the softmax operation, and the method further may include storing, in a memory, values of the exponential function obtained by the determining of the value of the exponential function.

The performing of the softmax operation may include: accumulating the values of the exponential function; and storing, in the memory, an accumulated value obtained by the accumulating.

The performing of the softmax operation further may include: determining a reciprocal of the accumulated value by inputting the accumulated value to the comparator; and storing the reciprocal in the memory.

The performing of the softmax operation further may include multiplying the value of the exponential function and the reciprocal.

The LUT may be generated by: generating the neural network to include a first layer, an activation function, and a second layer; training the neural network to output a value of the nonlinear function; transforming the first layer and the second layer of the trained neural network into a single integrated layer; and generating the LUT for determining the nonlinear function based on the integrated layer.

In another general aspect, one or more embodiments include a non-transitory computer-readable storage medium storing instructions that, when executed by a processor, configure the processor to perform any one, any combination, or all operations and methods described herein.

In another general aspect, a processor-implemented hardware accelerator method includes: generating a neural network comprising a first layer, an activation function, and a second layer; training the neural network to output a value of a nonlinear function; transforming the first layer and the second layer of the trained neural network into a single integrated layer; and generating a LUT for determining the nonlinear function based on the integrated layer.

The generating of the LUT may include: determining an address of the LUT based on a weight and a bias of the first layer; and determining a value of the LUT corresponding to the address based on a weight of the integrated layer.

The determining of the address may include determining a range value of the LUT; and determining the address corresponding to the range value.

The determining of the value of the LUT may include: determining a first value based on the weight of the integrated layer; and determining a second value based on the weight of the integrated layer and the bias of the first layer.

In another general aspect, a hardware accelerator includes: a processor configured to receive input data, load a lookup table (LUT), determine an address of the LUT by inputting the input data to a comparator, obtain a value of the LUT corresponding to the input data, and determine a value of a nonlinear function corresponding to the input data based on the value of the LUT, wherein the LUT is determined based on a weight of a neural network that outputs the value of the nonlinear function.

For the determining of the address, the processor may be configured to: compare, by the comparator, the input data and one or more preset range values; and determine the address based on a range value corresponding to the input data.

For the obtaining of the value of the LUT, the processor may be configured to obtain a first value and a second value corresponding to the address.

For the determining of the value of the nonlinear function, the processor may be configured to: perform a first operation of multiplying the input data and the first value; and perform a second operation of adding the second value to a result of the first operation.

The processor may be configured to perform a softmax operation based on the value of the nonlinear function.

The processor may be configured to: for the determining of the value of the nonlinear function, determine a value of an exponential function of each input data for the softmax operation; and store, in a memory, values of the exponential function obtained by the determining of the value of the exponential function.

For the performing of the softmax operation, the processor may be configured to: accumulate the values of the exponential function; and store, in the memory, an accumulated value obtained by the accumulating.

For the performing of the softmax operation, the processor may be configured to: determine a reciprocal of the accumulated value by inputting the accumulated value to the comparator; and store the reciprocal in the memory.

For the performing of the softmax operation, the processor may be configured to multiply the value of the exponential function and the reciprocal.

In another general aspect, a processor-implemented hardware accelerator method includes: determining an address of a lookup table (LUT) based on input data of a neural network, wherein the LUT is generated by integrating a first layer and a second layer of the neural network; obtaining a value of the LUT corresponding to the input data based on the address; and determining a value of a nonlinear function corresponding to the input data based on the value of the LUT.

The determining of the address may include: comparing the input data to one or more preset range values determined based on weights and biases of the first layer; and determining, based on a result of the comparing, the address based on a range value corresponding to the input data.

The one or more preset range values may be determined based on ratios of the biases and the weights.

The comparing may include comparing the input data to the one or more preset range values based on an ascending order of values of the ratios.

Other features and aspects will be apparent from the following detailed description, the drawings, and the claims.

Figure 1:
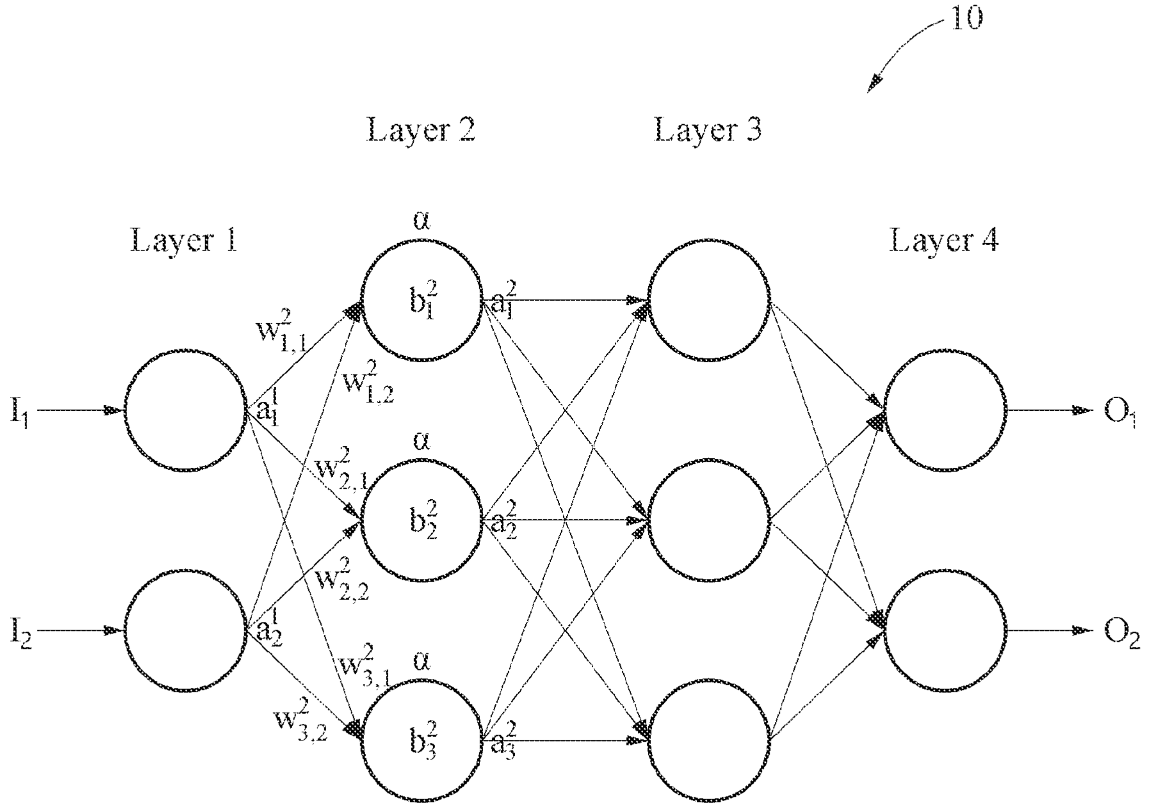
FIG. 1 illustrates an example of a neural network.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known, after an understanding of the disclosure of this application, may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. It will be further understood that the terms "comprises," "includes," and "has" specify the presence of stated features, numbers, operations, members, elements, and/or combinations thereof, but do not preclude the presence or addition of one or more other features, numbers, operations, members, elements, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween. Likewise, similar expressions, for example, "between" and "immediately between," and "adjacent to" and "immediately adjacent to," are also to be construed in the same way. As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein.

Also, in the description of example embodiments, detailed description of structures or functions that are thereby known after an understanding of the disclosure of the present application will be omitted when it is deemed that such description will cause ambiguous interpretation of the example embodiments.

The following example embodiments may be implemented in various forms of products, for example, a personal computer (PC), a laptop computer, a tablet PC, a smartphone, a television (TV), a smart home appliance, an intelligent vehicle, a kiosk, and a wearable device. Hereinafter, examples will be described in detail with reference to the accompanying drawings, and like reference numerals in the drawings refer to like elements throughout.

FIG. 1 illustrates an example of a neural network.

A neural network 10 will be described hereinafter with reference to FIG. 1. The neural network 10 may be of architecture including an input layer, hidden layers, and an output layer, and may perform an operation based on received input data, for example, $I_1$ and $I_2$ and generate output data, for example, $O_1$ and $O_2$, based on a result of performing the operation.

The neural network 10 may be a deep neural network (DNN) including one or more hidden layers, or an n-layer neural network. For example, as illustrated in FIG. 1, the neural network 10 may be a DNN including an input layer (Layer 1), two hidden layers (Layer 2 and Layer 3) and an output layer (Layer 4). The DNN may include, for example, a convolutional neural network (CNN), a recurrent neural network (RNN), a deep belief network, a restricted Boltzman machines, and the like, but examples of which are not limited to the foregoing examples.

When the neural network 10 is of DNN structure, the neural network 10 may include more layers that are used to extract valid information, and may thus process more complex data sets than an existing neural network. Although the neural network 10 is illustrated as including four layers, examples of which are not limited thereto. For example, the neural network 10 may include fewer or more layers. Also, the neural network 10 may include layers in various architectures different from one illustrated in FIG. 1. For example, the neural network 10 as a DNN may include a convolution layer, a pooling layer, and a fully connected layer.

Each of the layers included in the neural network 10 may include artificial nodes that are also known as "neurons," "processing elements (PEs)," "units," or and the like. While the nodes may be referred to as "artificial nodes" or "neurons," such reference is not intended to impart any relatedness with respect to how the neural network architecture computationally maps or thereby intuitively recognizes information and how a human's neurons operate. I.e., the terms "artificial nodes" or "neurons" are merely terms of art referring to the hardware implemented nodes of a neural network. As illustrated in FIG. 1, Layer 1 may include two nodes, and Layer 2 may include three nodes. However, examples are not limited thereto, and the layers included in the neural network 10 may include various numbers of nodes.

Nodes included in the layers included in the neural network 10 may be connected to each other to exchange data therebetween. For example, one node may receive data from other nodes to perform an operation, and may output a result of the operation to other nodes.

An output value of each of the nodes may be referred to as an activation. An activation may be an output value of one node and an input value of nodes included in a subsequent layer. Each of the nodes may determine its activation based on activations received from nodes included in a previous layer and on weights. A weight may be a parameter used to calculate an activation in each node, and may be a value assigned to a connection between the nodes.

Each of the nodes may be a computational unit that receives an input and outputs an activation, and may map the input and the output. For example, when σ is an activation function, $$w^i_{jk}$$

is a weight from a kth node included in an i−1th layer to a jth node included in an ith layer, $$b^i_j$$

is a bias value of the jth node included in the ith layer, and $$a^i_j$$

is an activation of the jth node of the ith layer, the activation $$a^i_j$$

may be represented by Equation 1 below, for example.

$$a^i_j = \sigma\left(\left(\sum_k w^i_{jk} \times a^{i-1}_k\right) + b^i_j\right) \quad \text{Equation 1}$$

As illustrated in FIG. 1, an activation of a first node of a second layer (Layer 2) may be represented as $$a^2_1.$$

In addition, $$a^2_1$$

may have a value of $$a^2_1 = a\left(w^2_{1.1} \times a^1_1 + w^2_{1.1} \times a^1_2 + b^2_1\right)$$

based on Equation 1. However, Equation 1 above may be provided merely as an example to describe an activation and a weight used to process data in a neural network, and examples of which are not limited thereto. An activation may be a value obtained by allowing a value obtained by applying an activation function to a weighted sum of activations received from a previous layer to pass through a rectified linear unit (ReLU).

As described above, in the neural network 10, numerous data sets may be exchanged between a plurality of interconnected channels and undergo numerous computational processes while passing through layers. Accordingly, a method of one or more embodiments may minimize a loss of accuracy while reducing a computational amount needed to process complex input data.

Figure 2:
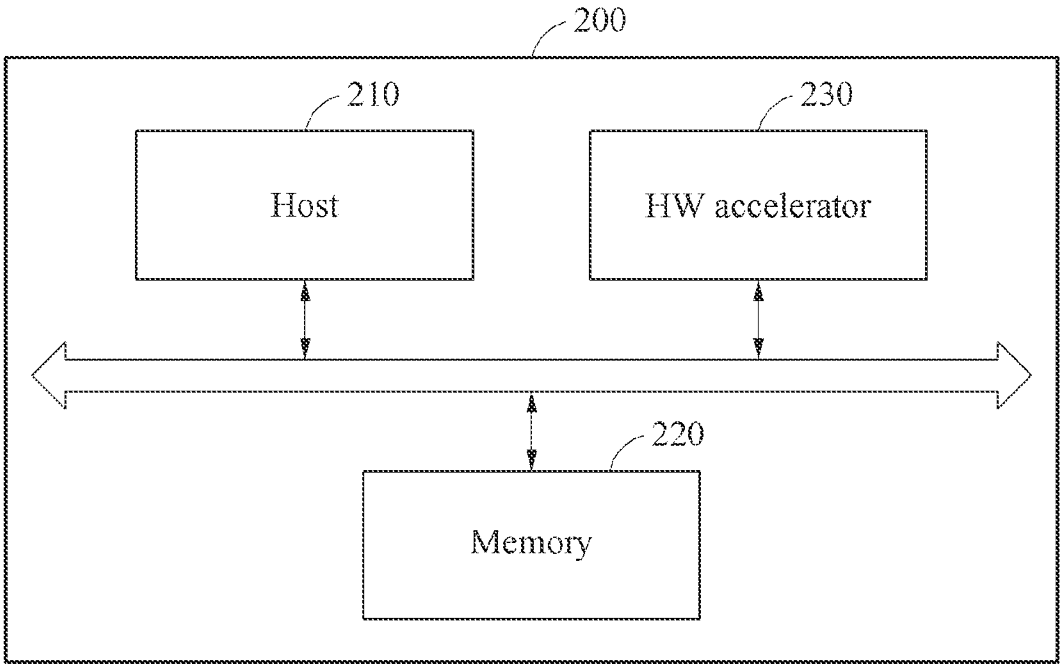
FIG. 2 illustrates an example of a hardware configuration of a neural network device.

FIG. 2 illustrates an example of a hardware configuration of a neural network device.

Referring to FIG. 2, a neural network device 200 may include a host 210, a hardware accelerator 230, and a memory 220. In the example of FIG. 2, only the components related to the example embodiments described herein are illustrated as being included in the neural network device 200. Thus, the neural network device 200 may also include other general-purpose components in addition to the components illustrated in FIG. 2.

The neural network device of one or more embodiments may analyze, in real time, a massive quantity of input data using a neural network and effectively process an operation associated with the neural network to extract desired information. The neural network device 200 may be a computing device having various processing functions, for example, a function of generating a neural network, a function of training a neural network, a function of quantizing a floating-point type neural network into a fixed-point type neural network, or a function of retraining a neural network. For example, the neural network device 200 may be, or may be implemented by, any of various types of devices, for example, a PC, a server device, a mobile device, and the like.

The host 210 may perform an overall function for controlling the neural network device 200. For example, the host 210 may control an overall operation of the neural network device 200 by executing programs stored in the memory 220 in the neural network device 200. The host 210 may be implemented as a central processing unit (CPU), a graphics processing unit (GPU), an application processor (AP), and the like, that are included in the neural network device 200, but examples of which are not limited thereto.

The host 210 may generate a neural network for computing or calculating (e.g., determining) a nonlinear function, and train the neural network. In addition, the host 210 may generate a lookup table (LUT) for computing or calculating the nonlinear function based on the neural network.

The memory 220 may be hardware for storing various sets of data processed in the neural network device 200. For example, the memory 220 may store data processed by the neural network device 200 and data to be processed by the neural network device 200. In addition, the memory 220 may store applications, drivers, and the like to be driven by the neural network device 200. The memory 220 may be a dynamic random-access memory (DRAM), but examples of which are not limited thereto. The memory 220 may include either one or both of a volatile memory and a nonvolatile memory.

The neural network device 200 may include the hardware accelerator 230 for driving the neural network. The hardware accelerator 230 may be, for example, any of a neural processing unit (NPU), a tensor processing unit (TPU), a neural engine, and the like, which are dedicated modules for driving the neural network, but examples of which are not limited thereto.

In one example, the hardware accelerator 230 may compute a nonlinear function using the LUT generated by the host 210. For bidirectional encoder representations from transformers (BERT)-based models, an operation such as a Gaussian error linear unit (GeLU), a softmax, and a layer normalization may be needed for an operation of each layer. A hardware accelerator (for example, an NPU) of a typical neural network device may not perform such an operation, and thus the operation may instead be performed in an external processor (such as the host 210), which may result in additional computation time due to communication between the typical hardware accelerator and the external processor. However, in contrast, the hardware accelerator 230 of the neural network device 200 of one or more embodiments may compute the nonlinear function using the LUT.

Figure 3:
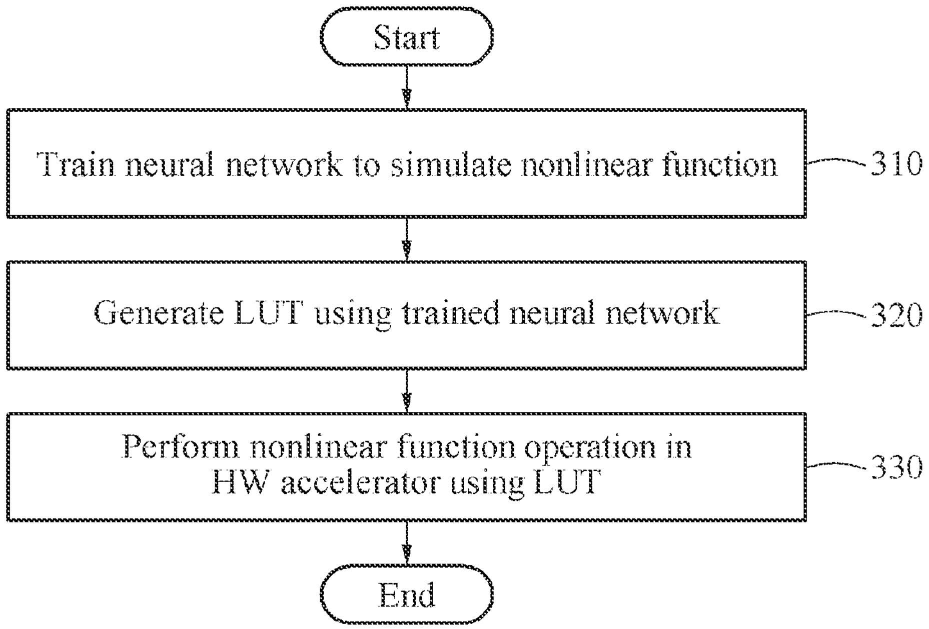
FIG. 3 illustrates an example of a flow of operations performed by a neural network device to compute a nonlinear function.

FIG. 3 illustrates an example of a flow of operations performed by a neural network device to compute a nonlinear function. Operations 310 through 330 to be described hereinafter with reference to FIG. 3 may be performed by the neural network device 200 of FIG. 2. The neural network device 200 may be, or may be implemented by, hardware or a combination of hardware and processor implementable instructions.

In operation 310, the host 210 may train a neural network for simulating a nonlinear function. For example, the host 210 may generate input data to be used to train the neural network. In addition, the host 210 may configure the neural network for simulating the nonlinear function, and train the neural network such that the neural network computes or calculates the nonlinear function using the input data. In one example, the neural network may include a first layer, an activation function (e.g., a ReLU function), and a second layer (e.g., among a plurality of first layers, activation functions, and second layers). Hereinafter, a non-limiting example method of training the neural network will be described in detail with reference to FIG. 4B.

In operation 320, the host 210 may generate a LUT using the trained neural network. For example, the host 210 may transform the first layer and the second layer of the neural network trained in operation 310 into a single integrated layer, and generate the LUT for computing or calculating the nonlinear function based on the integrated layer. Hereinafter, a non-limiting example method of generating the LUT will be described in detail with reference to FIG. 4C.

In operation 330, the hardware accelerator 230 (e.g., an NPU) may compute the nonlinear function using the LUT generated in operation 320. The computing of the nonlinear function may be include determining a value of the nonlinear function corresponding to the input data using the LUT. Herein, computing a nonlinear function may also be referred to as calculating a nonlinear function or performing a nonlinear function operation.

Figure 4A:
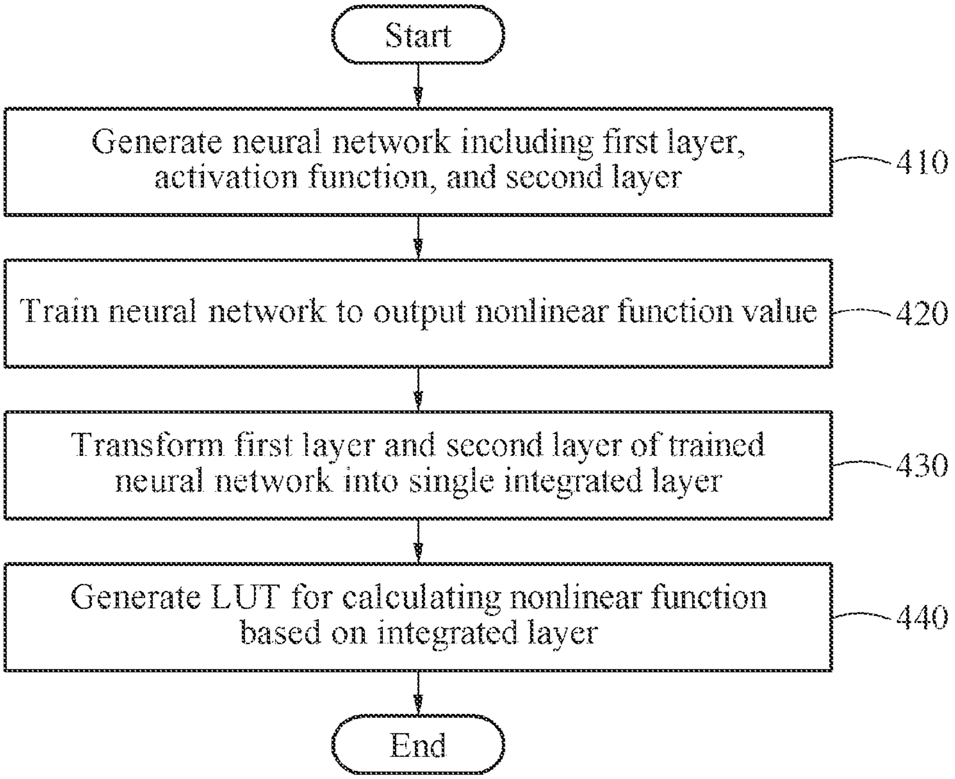
FIGS. 4A through 4C illustrate examples of generating a lookup table (LUT) to compute a nonlinear function.
Figure 4B:
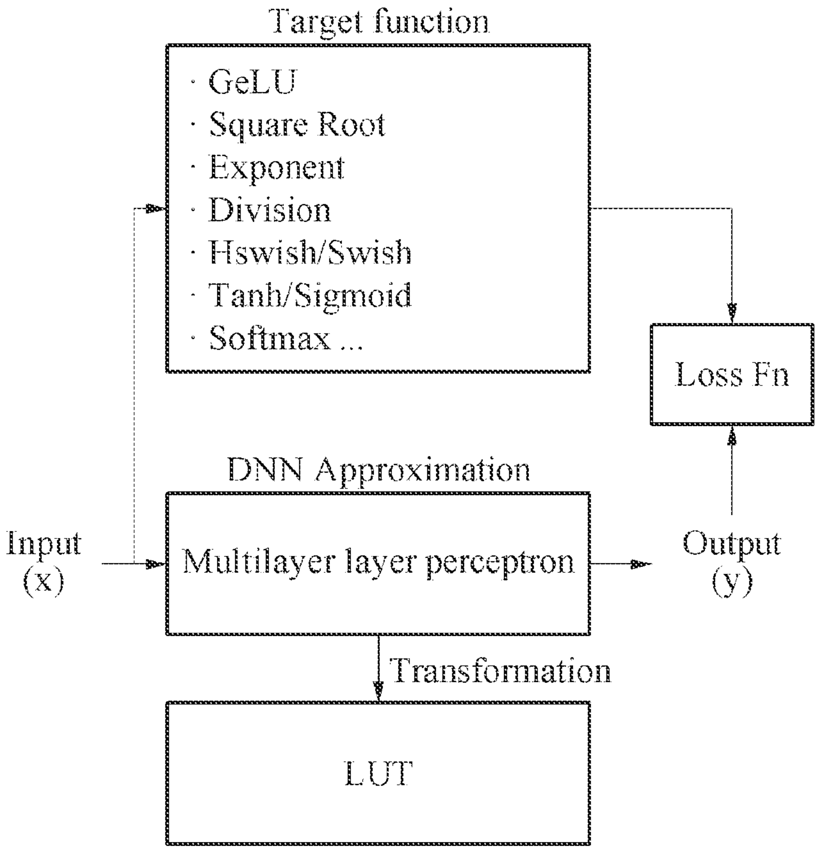
Figure 4C:
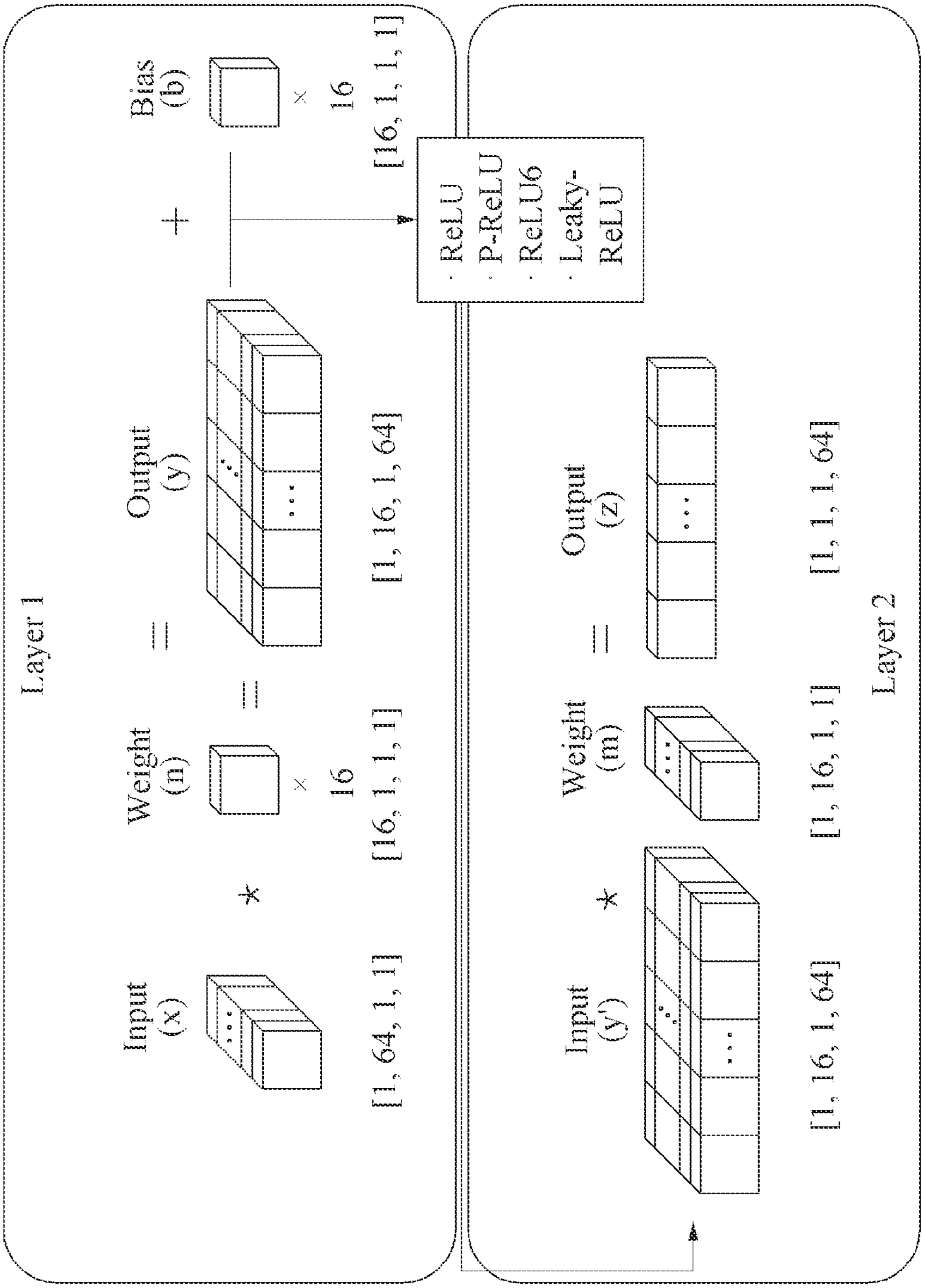

FIGS. 4A through 4C illustrate examples of generating a LUT to compute a nonlinear function.

Operations 410 through 430 to be described hereinafter with reference to FIG. 4A may be performed by the host 210 of FIG. 2. The host 210 may be, or may be implemented by, hardware or a combination of hardware and processor implementable instructions.

In operation 410, the host 210 may generate a neural network including a first layer, an activation function (e.g., a ReLU), and a second layer.

In operation 420, the host 210 may train the neural network such that the neural network outputs a value of a nonlinear function.

For example, referring to FIG. 4B, the host 210 may generate input data for training. In this example, the host 210 may generate the input data by generating N sets of data from −x to x at equal intervals and adding random noise that follows a normal distribution to the data.

The host 210 may generate a neural network including a first layer, an activation function (e.g., a ReLU function), and a second layer.

The host 210 may train the generated neural network such that the neural network simulates (or generates an output of) a nonlinear function using the input data. For example, the host 210 may train the neural network such that an error between an original function and an output distribution of the neural network is minimized, using a mean squared error (MSE) as a loss function.

Referring back to FIG. 4A, in operation 430, the host 210 may transform the first layer and the second layer of the trained neural network into a single integrated layer.

In operation 440, the host 210 may generate a LUT for computing or calculating the nonlinear function based on the integrated layer.

FIG. 4C illustrates an example of generating a LUT for computing or calculating a nonlinear function using a neural network trained when there are 16 hidden nodes, as a non-limiting example.

In the example of FIG. 4C, input data may be x, a weight and a bias of a first layer may be n and b, respectively, and an input activation, a weight, and an output activation of a second layer may be y', m, and z, respectively. In addition, an activation function a may be a ReLU function. In this example, the output activation of the second layer may be represented by Equation 2 below, for example.

$$z = \sum_{i=0}^{15} m_i(\sigma(n_i x + b_i) \qquad \text{Equation 2}$$

In addition, $n_i$ in Equation 2 may be taken out as represented by Equation 3 below, for example.

$$z = \sum_{i=0}^{15} m_i\left(\sigma\left(n_i\left(x + \frac{b_i}{n_i}\right)\right)\right) \qquad \text{Equation 3}$$

Equation 3 may then be simplified as represented by Equation 4 below, for example.

$$X_i = x + \frac{b_i}{n_i} \quad z = \sum_{i=0}^{15} m_i(\sigma(n_i X_i)) \qquad \text{Equation 4}$$

The ReLU function outputs an original value from a positive input without a change and outputs 0 from a negative input, and thus $n_i$ in Equation 4 may take a value out of the ReLU function under the same conditions as in Equation 5 below, for example.

$$\begin{aligned} &\text{if) } X_i XNOR n_i \qquad \text{Equation 5} \\ &\text{if) } X_i > 0 \\ &z = \sum_{i=0}^{15} (m_i n_i) X_i (n_i > 0) \\ &\text{else) } X_i < 0 \\ &z = \sum_{i=0}^{15} (m_i n_i) X_i (n_i < 0) \end{aligned}$$

A sign of $X_i$ may be determined to be a value obtained by adding x and $b_i n_i$. A value of $b_i n_i$ may be calculated in advance during training or learning. The host 210 may sort pre-calculated values of $b_i/n_i$ in ascending order from a smallest value to a greatest value. When a sum of x and $b_0/n_0$ (e.g., $X_0$) is a positive number, it may be ensured that subsequent values $x+x+b_1/n_i$, . . . , $x+b_{15}/n_{15}$ (e.g., $X_1$, . . . , $X_{15}$) are all positive numbers.

As described above, the ReLU function outputs the original value as it is from the positive input, and thus values $m_0 n_0$, . . . , $m_{15} n_{15}$ to be multiplied with $x+b_0/n_0$, . . . , $x+b_{15}/n_{15}$ (e.g., $X_0$, . . . , $X_{15}$) may need to be multiplied when $n_i$ is greater than 0 ($n_i>0$). $n_i^+$ may indicate that, only when an ith $n_i$ value a positive number, the value is applied as it is without a change. Conversely, $n_i^-$ may indicate that, only when a $n_i$ value is a negative number, the value is applied as it is without a change, and 0 is applied when the $n_i$ value is a positive number. This may be represented by Equation 6 below, for example.

$$\begin{aligned} &\text{if) } n_i \geq 0 \qquad \text{Equation 6} \\ &n_i^+ = n_i \\ &n_i^- = 0 \\ &\quad \text{else if)} \\ &\quad n_i^- = n_i \\ &\quad n_i^+ = 0 \end{aligned}$$

When $X_0$ is a positive number, the output activation value of the second layer may be represented by Equation 7 below, for example.

$$\text{if) } x_0 > -\frac{b_0}{n_0} \qquad \text{Equation 7}$$

$$x_0 m_0 n_0^+ + \frac{b_0}{n_0} m_0 n_0^+ + x_0 m_1 n_1^+ + \frac{b_1}{n_1} m_1 n_1^+ + \ldots + x_0 m_{15} n_{15}^+ + \frac{b_{15}}{n_{15}} m_{15} n_{15}^+ = \overbrace{\boxed{(m_0 n_0^+ + m_1 n_1^+ + \ldots + m_{15} n_{15}^+)}}^{s_0} x_0 + \overbrace{\boxed{\frac{b_0}{n_0} m_0 n_0^+ + \frac{b_1}{n_1} m_1 n_1^+ + \ldots + \frac{b_{15}}{n_{15}} m_{15} n_{15}^+}}^{t_0}$$

In Equation 7, when common factors of $x_0$ are bound, values may be substituted by $s_0$ and $t_0$ as indicated in red dotted lines.

Similarly, when, although the sum of x and $b_0/n_0$ is a negative number, $x+b_1/n_1$ is a positive number, $x+b_2/n_2$, . . . , $x+b_{15}/n_{15}$ may be all positive numbers. In addition, a part where $x+b_0/n_0<0$ needs to be multiplied by a value when $n_i<0$, and thus $m_0 m_0^-$ may be multiplied with $x+b_0/n_0$. In addition, $x+b_2/n_2$, . . . , $x+b_{15}/n_{15}$ are positive numbers, and thus $m_0 n_0^+$ may be multiplied. This may be represented by Equation 8 below, for example.

$$\text{else if) } -\frac{b_1}{n_1} < x_0 < -\frac{b_0}{n_0} \qquad \text{Equation 8}$$

$$x_0 m_0 n_0^- + \frac{b_0}{n_0} m_0 n_0^+ + x_0 m_1 n_1^+ + \frac{b_1}{n_1} m_1 n_1^+ + \ldots + x_0 m_{15} n_{15}^+ + \frac{b_{15}}{n_{15}} m_{15} n_{15}^+ =$$

-continued $$\overset{s_1}{\boxed{(m_0n_0^- + m_1n_1^+ + \ldots + m_{15}n_{15}^+)}}\, x_0 + \overset{t_1}{\boxed{\frac{b_0}{n_0}m_0n_0^- + \frac{b_1}{n_1}m_1n_1^+ + \ldots + \frac{b_{15}}{n_{15}}m_{15}n_{15}^+}}$$

Similarly, when applied to all other hidden node operations, a total of 16 s and t cases may be derived depending on a range of x. The hardware accelerator 230 may use bin, as a reference for a comparator and use $s_i$ and $t_i$ values as a LUT value. This may be represented by Equation 9 below, for example.

$$\text{if) } x_0 > -\frac{b_0}{n_0} \quad \text{Equation 9}$$

$$x_0m_0n_0^+ + \frac{b_0}{n_0}m_0n_0^+ + x_0m_1n_1^+ + \frac{b_1}{n_1}m_1n_1^+ + \ldots + x_0m_{15}n_{15}^+ + \frac{b_{15}}{n_{15}}m_{15}n_{15}^+ =$$

$$\overset{s_0}{\boxed{(m_0n_0^+ + m_1n_1^+ + \ldots + m_{15}n_{15}^+)}}\, x_0 + \overset{t_0}{\boxed{\frac{b_0}{n_0}m_0n_0^+ + \frac{b_1}{n_1}m_1n_1^+ + \ldots + \frac{b_{15}}{n_{15}}m_{15}n_{15}^+}}$$

$$\overset{\text{Sort ascending}}{\overrightarrow{\frac{b_0}{n_0} < \frac{b_1}{n_1} < \ldots < \frac{b_{14}}{n_{14}} < \frac{b_{15}}{n_{15}}}}$$

$$\text{else if) } -\frac{b_1}{n_1} < x_0 < -\frac{b_0}{n_0}$$

$$x_0m_0n_0^- + \frac{b_0}{n_0}m_0n_0^+ + x_0m_1n_1^+ + \frac{b_1}{n_1}m_1n_1^+ + \ldots + x_0m_{15}n_{15}^+ + \frac{b_{15}}{n_{15}}m_{15}n_{15}^+ =$$

$$\overset{s_1}{\boxed{(m_0n_0^- + m_1n_1^+ + \ldots + m_{15}n_{15}^+)}}\, x_0 + \overset{t_1}{\boxed{\frac{b_0}{n_0}m_0n_0^- + \frac{b_1}{n_1}m_1n_1^+ + \ldots + \frac{b_{15}}{n_{15}}m_{15}n_{15}^+}}$$

$$\ldots$$

$$\text{else if) } x_0 < -\frac{b_{15}}{n_{15}}$$

$$x_0m_0n_0^- + \frac{b_0}{n_0}m_0n_0^- + x_0m_1n_1^- + \frac{b_1}{n_1}m_1n_1^- + \ldots + x_0m_{15}n_{15}^- + \frac{b_{15}}{n_{15}}m_{15}n_{15}^- =$$

$$\overset{s_{15}}{\boxed{(m_0n_0^- + m_1n_1^- + \ldots + m_{15}n_{15}^-)}}\, x_0 + \overset{t_{15}}{\boxed{\frac{b_0}{n_0}m_0n_0^- + \frac{b_1}{n_1}m_1n_1^- + \ldots + \frac{b_{15}}{n_{15}}m_{15}n_{15}^-}}$$

Hereinafter, for the convenience of description, $s_i$ and $t_i$ may be referred to as a first value and a second value, respectively.

Figure 5A:
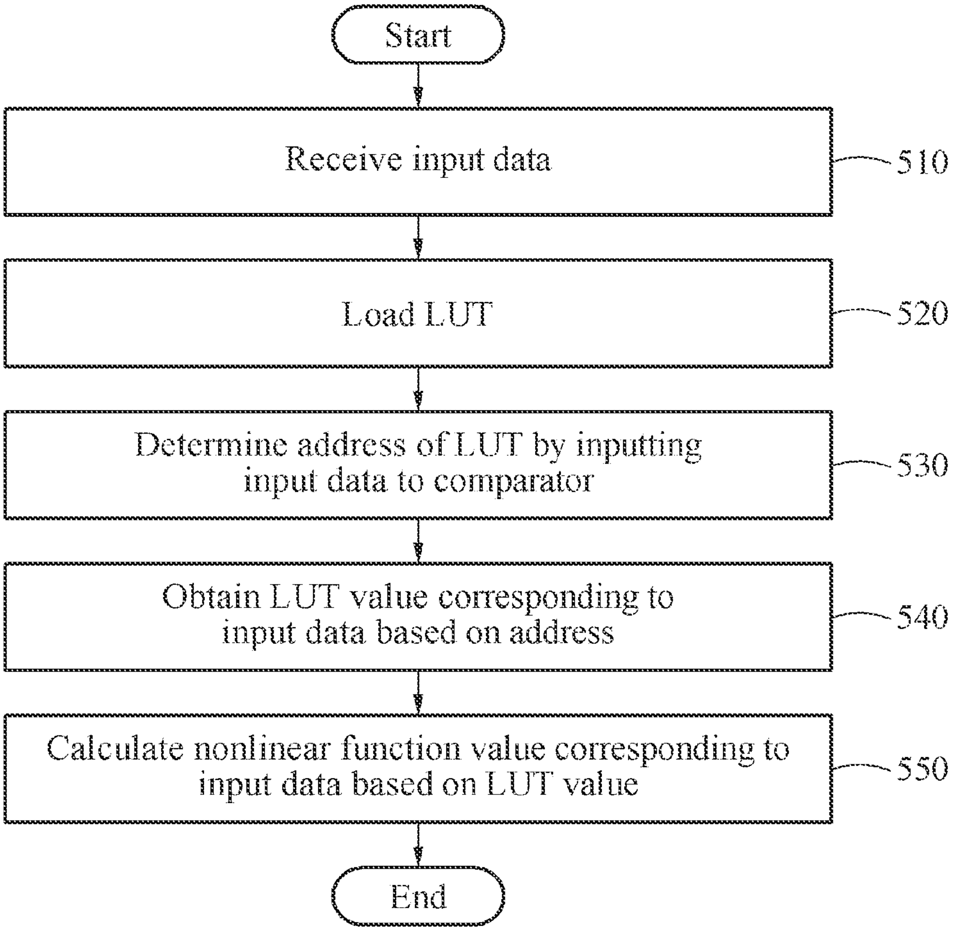
FIGS. 5A and 5B illustrate examples of computing a nonlinear function in a hardware accelerator.
Figure 5B:
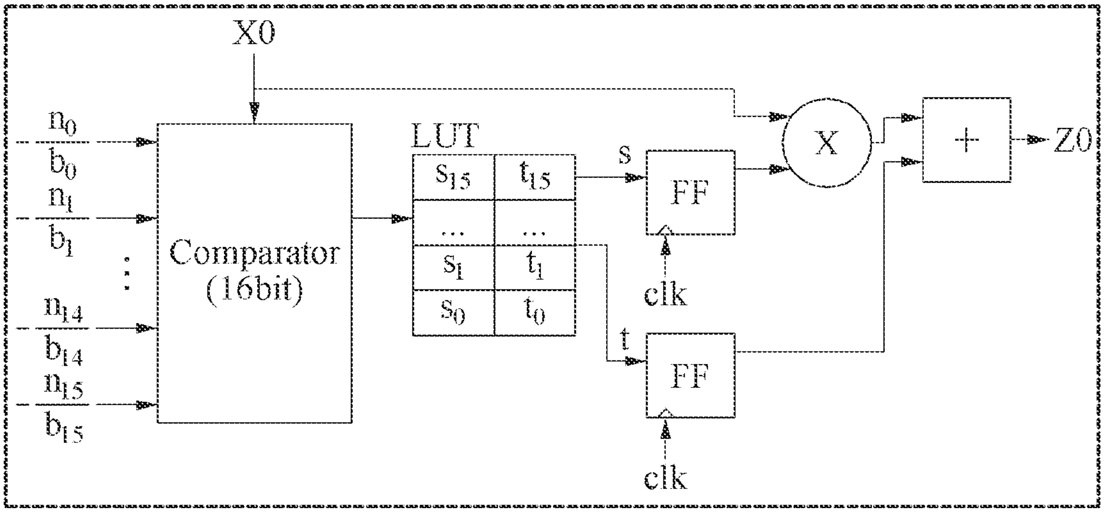

FIGS. 5A and 5B illustrate examples of computing or calculating a nonlinear function in a hardware accelerator.

Operations 510 through 550 to be described hereinafter with reference to FIG. 5A may be performed by the hardware accelerator 230 described above with reference to FIGS. 1 to 4C.

In operation 510, the hardware accelerator 230 may receive input data.

In operation 520, the hardware accelerator 230 may load a LUT.

In operation 530, the hardware accelerator 230 may determine an address of the LUT by inputting the input data to a comparator of the hardware accelerator 230.

In operation 540, the hardware accelerator 230 may obtain a LUT value corresponding to the input data based on the address.

In operation 550, the hardware accelerator 230 may calculate a nonlinear function value corresponding to the input data based on the LUT value.

For example, in operation 530, referring to FIG. 5B, the hardware accelerator 230 may compare, in the comparator, the input data and one or more preset range values, and determine an address based on a range value corresponding to the input data. The one or more range values may be determined based on $b_i/n_i$ described above with reference to FIGS. 4A to 4C. For example, values of $b_i/n_i$ may be input to the comparator, and the hardware accelerator 230 may compare a value of x and the values in ascending order from $-b_0/n_0$. When x is greater than $-b_0/n_0$, $-b_1/n_1<x<-b_0/n_0$ may be compared. When a conditional equation is satisfied while comparing x, the hardware accelerator 230 may determine an address corresponding to a corresponding range.

The hardware accelerator 230 may obtain a first value (e.g., $s_i$) and a second value (e.g., $t_i$) corresponding to the address.

Further, the hardware accelerator 230 may calculate a nonlinear function value corresponding to the input data by performing a first operation of multiplying the input data and the first value, and performing a second operation of adding the second value to a result of the first operation.

Figure 5C:
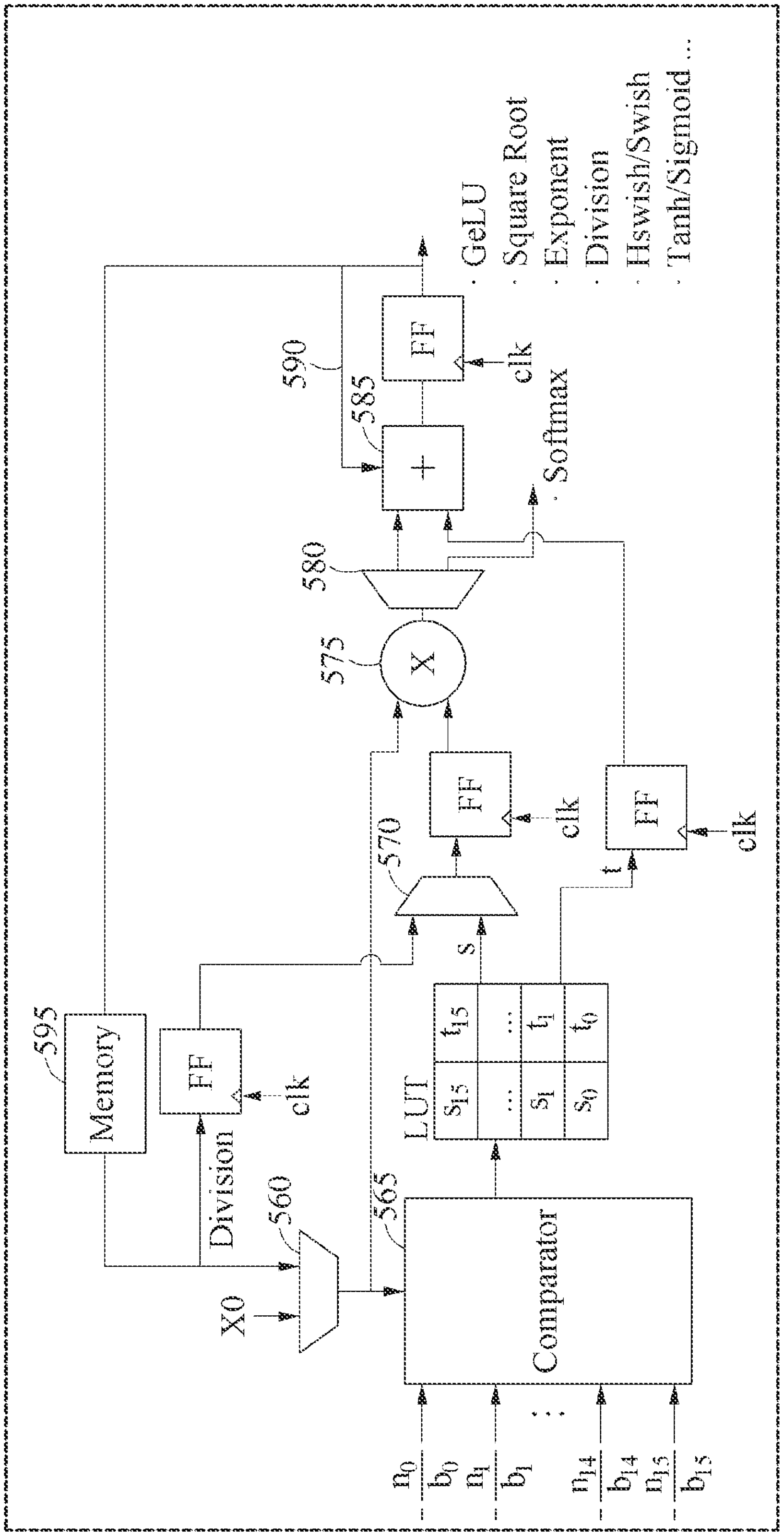
FIG. 5C illustrates an example of performing a softmax operation in a hardware accelerator.

FIG. 5C illustrates an example of performing a softmax operation in a hardware accelerator.

The hardware accelerator 230 may include a first multiplexer (mux) 560, a comparator 565, a second mux 570, a multiplier 575, a demux 580, a feedback circuit 590, a memory 595, and an adder 585.

The hardware accelerator 230 may perform, using a LUT, a softmax operation as represented by Equation 10 below, for example.

$$\sigma(\vec{z})_i = \frac{e^{z_i}}{\sum_{j=1}^{K} e^{z_j}} \quad \text{Equation 10}$$

For example, the hardware accelerator 230 may compute or calculate an exponential function value (e.g., $e^{z_i}$) of each input data for a softmax operation through the method described above with reference to FIGS. 5A and 5B. That is, the exponential function may also be a nonlinear function, and thus the host 210 may train a neural network that outputs the exponential function, and generate a LUT using the trained neural network. The hardware accelerator 230 may then compute or calculate a value of the exponential function (e.g., $e^{z_i}$) of each input data using the LUT. In addition, the hardware accelerator 230 may store the value of the exponential function in the memory 595.

The hardware accelerator 230 may also accumulate respective calculated exponential function values using the feedback circuit 590, and store an accumulated value $$\sum_{j=1}^{K} e^{z_j}$$

obtained by the accumulating in the memory 595.

The hardware accelerator 230 may input the accumulated value to the comparator 565, and calculate a reciprocal value $$1/\sum_{j=1}^{K} e^{z_j}$$

of the accumulated value $$\sum_{j=1}^{K} e^{z_j}.$$

That is, a function of calculating the reciprocal value is also a nonlinear function, and thus the hardware accelerator 230 may calculate the reciprocal value $$1/\sum_{j=1}^{K} e^{z_j}$$

of the accumulated value $$\sum_{j=1}^{K} e^{z_j}$$

using a LUT corresponding to the function. The hardware accelerator 230 may store the reciprocal value of the accumulated value $$1/\sum_{j=1}^{K} e^{z_j}$$

in the memory 595.

In one example, the first mux 560 may output a corresponding exponential function value (e.g., $e^{z_i}$), and the second mux 570 may output a reciprocal value (e.g., $$1/\sum_{j=1}^{K} e^{z_j}$$

). The multiplier 575 may multiply the exponential function value (e.g., $e^{z_i}$) and the reciprocal value of the accumulated value $$\left(1/\sum_{j=1}^{K} e^{z_j}\right).$$

The demux 580 may output a result of the softmax operation obtained by multiplying the exponential function value (e.g., $e^{z_i}$) and the reciprocal value of the accumulated value (e.g., $$1/\sum_{j=1}^{K} e^{z_j}$$

).

In one example, the hardware accelerator 230 of one or more embodiments may approximate various nonlinear functions to one framework, and thus it is not necessary to find an optimal range and variable through a numerical analysis for each function every time. Thus, when the framework operates, the hardware accelerator 230 of one or more embodiments may determine the optimal range and variable (for example, an address and value of a LUT).

While a typical method and/or accelerator may divide a range in a uniform manner and have a great error, the method and hardware accelerator of one or more embodiments described herein may have a small error because a part that may be approximated by dividing a function more precisely is found by training a neural network.

Figure 6:
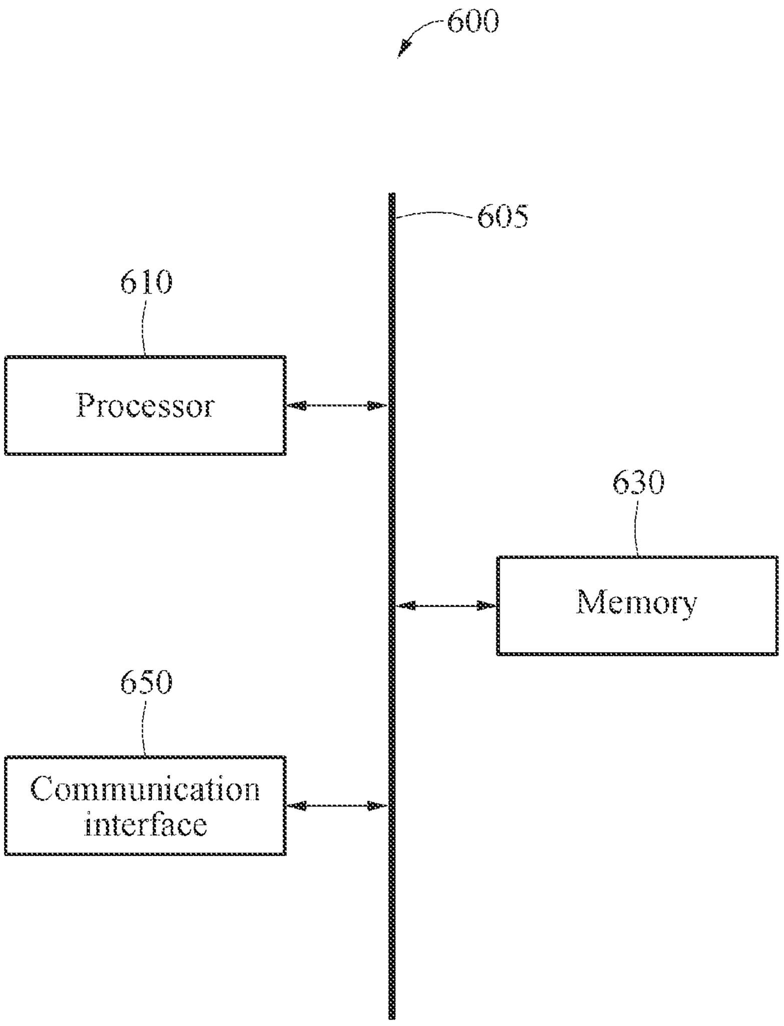
FIG. 6 illustrates an example of a hardware accelerator.

FIG. 6 illustrates an example of a hardware accelerator.

Referring to FIG. 6, a hardware accelerator 600 may include a processor 610 (e.g., one or more processors), a memory 630 (e.g., one or more memories), and a communication interface 650. The processor 610, the memory 630, and the communication interface 650 may communicate with one another through a communication bus 605.

The processor 610 may perform any one, any combination, or all of the methods and/or operations described above with reference to FIGS. 1 through 5C or an algorithm corresponding to any of the methods and/or operations. The processor 610 may execute a program and control the hardware accelerator 600. A code of the program executed by the processor 610 may be stored in the memory 630.

The processor 610 may receive input data, load a LUT, determine an address of the LUT by inputting the received input data to a comparator, obtain a LUT value corresponding to the input data based on the address, and calculate a value of a nonlinear function corresponding to the input data based on the LUT value.

The memory 630 may store data processed by the processor 610. For example, the memory 630 may store the program. The stored program may be a set of syntaxes that is coded to perform speech recognition and thereby executed by the processor 610. The memory 630 may be a volatile or nonvolatile memory.

The communication interface 650 may be connected to the processor 610 and the memory 630 to transmit and/or receive data. The communication interface 650 may be connected to another external device to transmit and/or receive data. The expression used herein "transmitting and/or receiving A" may be construed as transmitting and/or receiving information or data that indicates A.

The communication interface 650 may be implemented as a circuitry in the hardware accelerator 600. For example, the communication interface 650 may include an internal bus and an external bus. For another example, the communication interface 650 may be an element that connects an output token determining device and an external device. The communication interface 650 may receive data from an external device and transmit the data to the processor 610 and the memory 630.

The hardware accelerators, neural network devices, hosts, memories, first muxs, comparators, second muxs, multipliers, demuxs, adders, feedback circuits, processors, communication interfaces, communication buses, neural network device 200, host 210, hardware accelerator 230, memory 220, first mux 560, comparator 565, second mux 570, multiplier 575, demux 580, adder 585, feedback circuit 590, memory 595, hardware accelerator 600, processor 610, memory 630, communication interface 650, communication bus 605, and other apparatuses, devices, units, modules, and components described herein with respect to FIGS. 1-6 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-6 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

What is claimed is:

1. A hardware accelerator, comprising:

a processor configured to receive input data from a host processor external to the hardware accelerator, load a lookup table (LUT) generated by the host processor, determine an address of the LUT by comparing, by a comparator, the input data and one or more preset range values determined based on ratios of values of a neural network, obtain a value of the LUT corresponding to the input data, and determine a value of a nonlinear function corresponding to the input data based on the value of the LUT, wherein the LUT is determined based on a weight of the neural network, wherein the neural network outputs the value of the nonlinear function, and wherein the determined value of the nonlinear function is transmitted to the host processor.

2. The hardware accelerator of claim 1, wherein, for the determining of the address, the processor is configured to:

determine the address based on a range value corresponding to the input data.

3. The hardware accelerator of claim 1, wherein, for the obtaining of the value of the LUT, the processor is configured to:

obtain a first value and a second value corresponding to the address.

4. The hardware accelerator of claim 3, wherein, for the determining of the value of the nonlinear function, the processor is configured to:

perform a first operation of multiplying the input data and the first value; and perform a second operation of adding the second value to a result of the first operation.

5. The hardware accelerator of claim 1, wherein the processor is configured to:

perform a softmax operation based on the value of the nonlinear function.

6. The hardware accelerator of claim 5, wherein the processor is configured to:

for the determining of the value of the nonlinear function, determine a value of an exponential function of each input data for the softmax operation; and store, in a memory, values of the exponential function obtained by the determining of the value of the exponential function.

7. The hardware accelerator of claim 6, wherein, for the performing of the softmax operation, the processor is configured to:

accumulate the values of the exponential function; and store, in the memory, an accumulated value obtained by the accumulating.

8. The hardware accelerator of claim 7, wherein, for the performing of the softmax operation, the processor is configured to:

determine a reciprocal of the accumulated value by inputting the accumulated value to the comparator; and store the reciprocal in the memory.

9. The hardware accelerator of claim 7, wherein, for the performing of the softmax operation, the processor is configured to:

multiply the value of the exponential function and a reciprocal of the accumulated value.

10. A processor-implemented hardware accelerator method, the method comprising:

receiving input data from a host processor external to a hardware accelerator;

loading a lookup table (LUT) generated by the host processor;

determining an address of the LUT comparing, by a comparator, the input data and one or more preset range values determined based on ratios of values of a neural network;

obtaining a value of the LUT corresponding to the input data based on the address; and determining a value of a nonlinear function corresponding to the input data based on the value of the LUT, wherein the LUT is determined based on a weight of the neural network, wherein the neural network outputs the value of the nonlinear function, and wherein the determined value of the nonlinear function is transmitted to the host processor.

11. The method of claim 10, wherein the determining of the address comprises:

determining the address based on a range value corresponding to the input data.

12. The method of claim 10, wherein the obtaining of the value of the LUT comprises:

obtaining a first value and a second value corresponding to the address.

13. The method of claim 12, wherein the determining of the value of the nonlinear function comprises:

performing a first operation of multiplying the input data and the first value; and performing a second operation of adding the second value to a result of the first operation.

14. The method of claim 10, further comprising:

performing a softmax operation based on the value of the nonlinear function.

15. The method of claim 14, wherein the determining of the value of the nonlinear function comprises determining a value of an exponential function of each input data for the softmax operation, and the method further comprises storing, in a memory, values of the exponential function obtained by the determining of the value of the exponential function.

16. The method of claim 15, wherein the performing of the softmax operation comprises:

accumulating the values of the exponential function; and storing, in the memory, an accumulated value obtained by the accumulating.

17. The method of claim 16, wherein the performing of the softmax operation further comprises:

determining a reciprocal of the accumulated value by inputting the accumulated value to the comparator; and storing the reciprocal in the memory.

18. The method of claim 17, wherein the performing of the softmax operation further comprises:

multiplying the value of the exponential function and the reciprocal.

19. The method of claim 10, wherein the LUT is generated by:

generating the neural network to include a first layer, an activation function, and a second layer;

training the neural network to output a value of the nonlinear function;

transforming the first layer and the second layer of the trained neural network into a single integrated layer; and generating, based on the integrated layer, the LUT for determining the nonlinear function.

20. The method of claim 10, wherein a non-transitory computer-readable storage medium stores instructions that, when executed by a processor, configure the processor to perform the receiving of the input data, the loading of the LUT, the determining of the address of the LUT, the obtaining of the value of the LUT, and the determining of the value of the nonlinear function.

21. A processor-implemented hardware accelerator method, the method comprising:

using a host processor, generating a lookup table (LUT) for determining a nonlinear function by:

generating a neural network comprising a first layer, an activation function, and a second layer;

training the neural network to output a value of the nonlinear function;

transforming the first layer and the second layer of the trained neural network into a single integrated layer; and generating, based on the integrated layer and ratios of values of the neural network, the LUT; and using a hardware accelerator, determining the value of the nonlinear function corresponding to the input data based on a value of the LUT.

22. The method of claim 21, wherein the generating of the LUT comprises:

determining an address of the LUT based on a weight and a bias of the first layer; and determining, based on a weight of the integrated layer, a value of the LUT corresponding to the address.

23. The method of claim 22, wherein the determining of the address comprises:

determining a range value of the LUT; and determining the address corresponding to the range value.

24. The method of claim 22, wherein the determining of the value of the LUT comprises:

determining a first value based on the weight of the integrated layer; and determining a second value based on the weight of the integrated layer and the bias of the first layer.

25. A processor-implemented hardware accelerator method, the method comprising:

determining, by comparing input data received from a host processor external to a hardware accelerator and one or more preset range values determined based on ratios of values of a neural network, an address of a lookup table (LUT) generated by the host processor, wherein the LUT is generated by integrating a first layer and a second layer of the neural network;

obtaining a value of the LUT corresponding to the input data based on the address; and determining a value of a nonlinear function corresponding to the input data based on the value of the LUT, wherein the determined value of the nonlinear function is transmitted to the host processor.

26. The method of claim 25, wherein the determining of the address comprises:

comparing the input data to one or more preset range values determined based on weights and biases of the first layer; and determining, based on a result of the comparing, the address based on a range value corresponding to the input data.

27. The method of claim 26, wherein the one or more preset range values are determined based on ratios of the biases and the weights.

28. The method of claim 27, wherein the comparing comprises comparing the input data to the one or more preset range values based on an ascending order of values of the ratios.

* * * * *